United States Patent
Joo et al.

(10) Patent No.: US 10,790,024 B2
(45) Date of Patent: Sep. 29, 2020

(54) SEMICONDUCTOR DEVICE AND OPERATING METHOD OF THE SEMICONDUCTOR DEVICE

(71) Applicant: SK hynix Inc., Icheon-si, Gyeonggi-do (KR)

(72) Inventors: Han Soo Joo, Daejeon (KR); Ji Hyun Seo, Seoul (KR); Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/424,124

(22) Filed: May 28, 2019

(65) Prior Publication Data

US 2020/0143883 A1 May 7, 2020

(30) Foreign Application Priority Data

Nov. 2, 2018 (KR) .................. 10-2018-0133781

(51) Int. Cl.
  *G11C 16/04* (2006.01)
  *G11C 16/08* (2006.01)
  *G11C 16/24* (2006.01)
  *G11C 16/26* (2006.01)
(52) U.S. Cl.
  CPC .......... *G11C 16/0483* (2013.01); *G11C 16/08* (2013.01); *G11C 16/24* (2013.01); *G11C 16/26* (2013.01)
(58) Field of Classification Search
  CPC ..... G11C 16/0483; G11C 16/24; G11C 16/26; G11C 16/08
  See application file for complete search history.

(56) References Cited

U.S. PATENT DOCUMENTS

| 8,942,042 | B2* | 1/2015 | Lee ..................... G11C 16/10 |
| | | | 365/185.17 |
| 9,171,627 | B2* | 10/2015 | Lee ................. G11C 16/0483 |
| 9,196,365 | B2* | 11/2015 | Park ..................... G11C 16/10 |
| 9,520,198 | B2* | 12/2016 | Choi .................... G11C 16/24 |
| 9,653,172 | B2* | 5/2017 | Lee ..................... G11C 16/28 |
| 9,672,929 | B2 | 6/2017 | Maejima |
| 10,269,570 | B2* | 4/2019 | Lee ..................... H01L 29/513 |
| 2015/0294726 | A1* | 10/2015 | Sim ................. G11C 16/0483 |
| | | | 365/185.12 |
| 2019/0279726 | A1* | 9/2019 | Li ..................... G11C 11/4085 |

FOREIGN PATENT DOCUMENTS

KR    101259792 B1    5/2013
KR    1020140101625 A    8/2014

* cited by examiner

*Primary Examiner* — Tri M Hoang
(74) *Attorney, Agent, or Firm* — William Park & Associates Ltd.

(57) ABSTRACT

A semiconductor device and method of operating a semiconductor device, the semiconductor device includes memory strings coupled between a common source line and a bit line, and a peripheral circuit coupled to the memory strings through a plurality of word lines and a dummy word line, and configured to set bias of the word lines and the dummy word line before performing a read operation, wherein the peripheral circuit applies a first pass voltage to the word lines concurrently with applying an initial voltage lower than the first pass voltage to the dummy word line, and increases the first pass voltage and the initial voltage to a second pass voltage to set the bias of the word lines and the dummy word line.

10 Claims, 12 Drawing Sheets

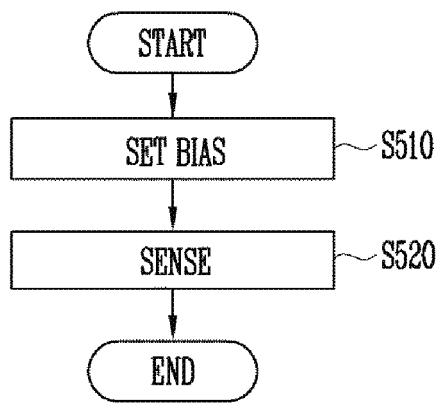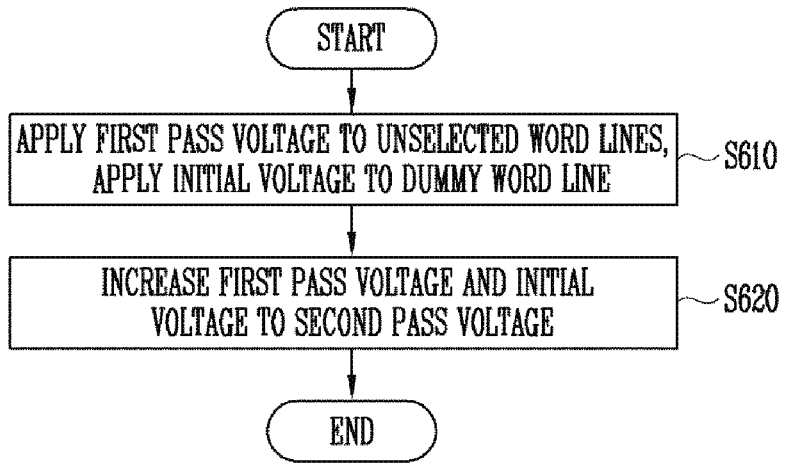

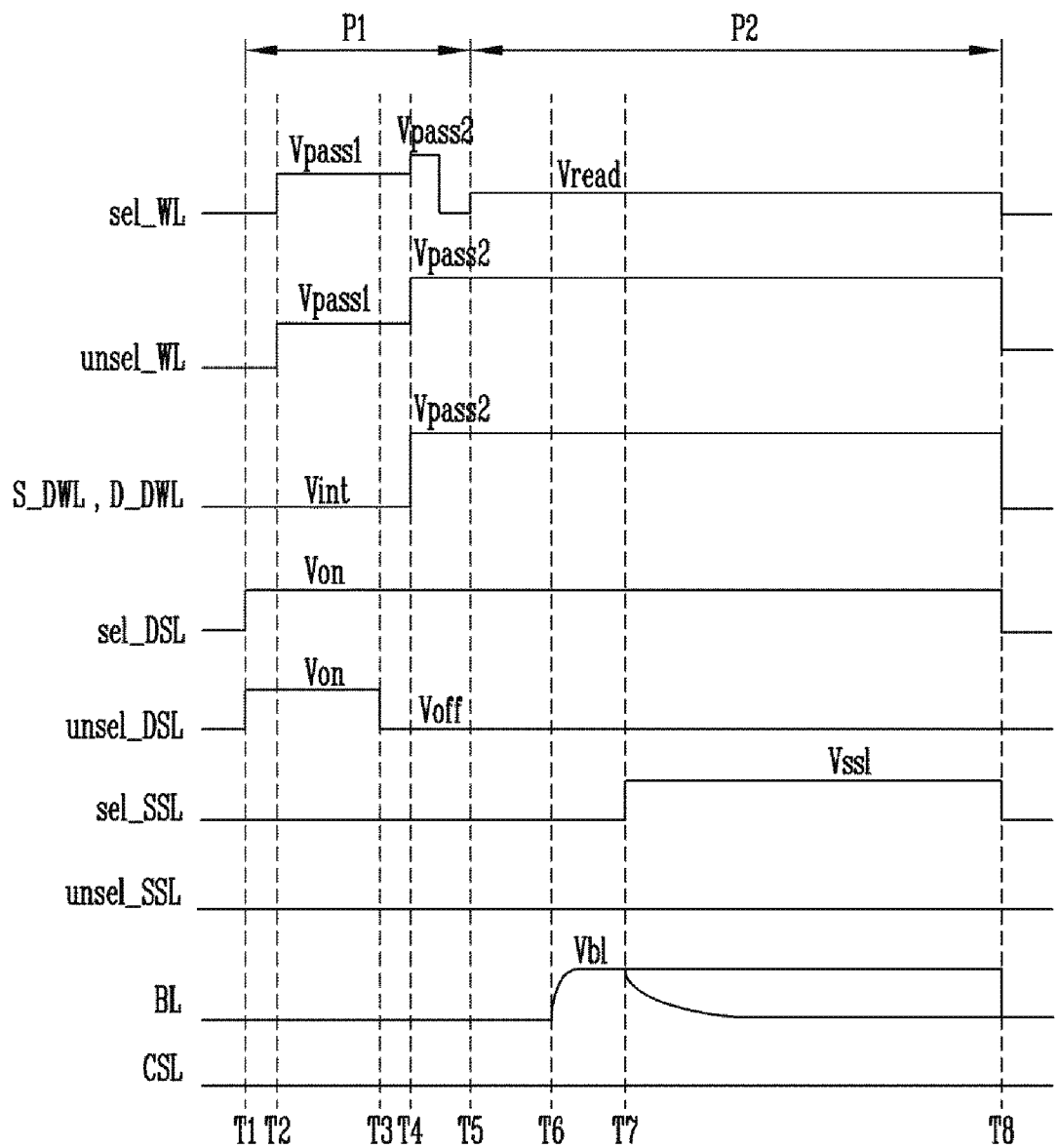

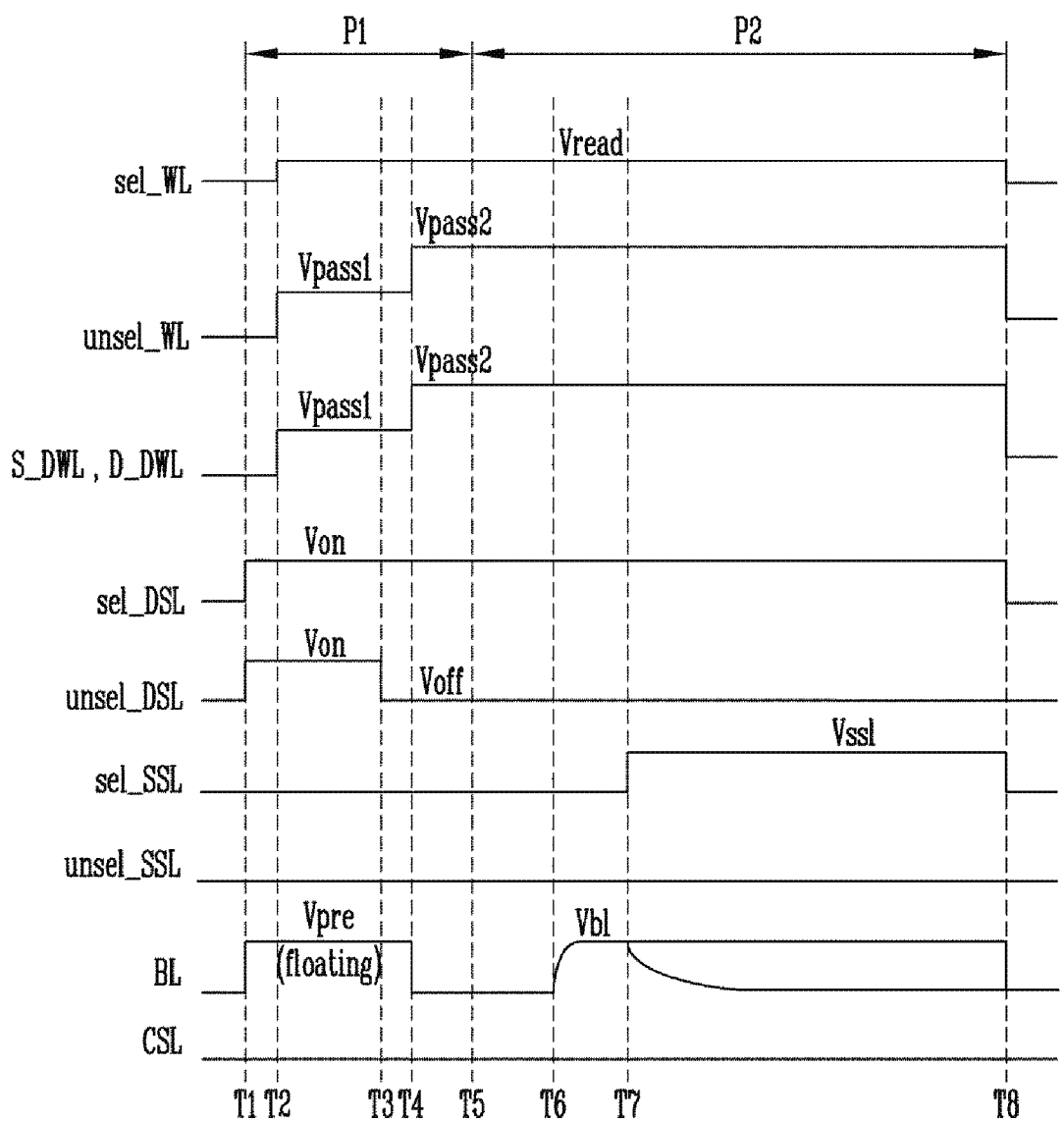

SEMICONDUCTOR DEVICE AND OPERATING METHOD OF THE SEMICONDUCTOR DEVICE

CROSS-REFERENCE TO RELATED APPLICATION

The present application claims priority under 35 U.S.C. § 119(a) to Korean patent application number 10-2018-0133781, filed on Nov. 2, 2018, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a method of operating the same.

2. Related Art

Semiconductor memory devices are storage devices made of semiconductor materials such as silicon (Si), germanium (Ge), gallium arsenide (GaAs), and indium phosphide (InP). Semiconductor memory devices are classified into volatile memory devices and non-volatile memory devices.

Volatile memory devices lose stored data when the power is off. Examples of volatile memory devices may include Static RAM (SRAM), Dynamic RAM (DRAM) and Synchronous DRAM (SDRAM). Nonvolatile memory devices may retain stored data independent of the availability of power. Examples of the nonvolatile memory devices may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. Flash memory may be generally classified into NOR-type memory and NAND-type memory.

SUMMARY

According to an embodiment, a method of operating a semiconductor device, wherein the semiconductor device includes memory strings that are coupled between a common source line and a bit line, and each of the memory strings includes memory cells, select transistors, and a dummy memory cell that is coupled between the memory cells and the select transistors, and the method may include applying a first pass voltage to unselected word lines among word lines coupled to the memory cells, respectively, applying an initial voltage lower than the first pass voltage to a dummy word line coupled to the dummy memory cell when the first pass voltage is applied, increasing the first pass voltage and the initial voltage to a second pass voltage, and sensing data from a selected memory cell of a selected memory string among the memory strings.

According to an embodiment, a method of operating a semiconductor device, wherein the semiconductor device includes memory strings that are coupled between a common source line and a bit line, and each of the memory strings includes memory cells and select transistors, the method may include applying a first pass voltage to unselected word lines among word lines coupled to the memory cells, respectively, precharging at least one of the common source line and the bit line when the first pass voltage is applied, increasing the first pass voltage to a second pass voltage, and sensing data from a selected memory cell of a selected memory string among the memory strings.

According to an embodiment, a semiconductor device may include memory strings coupled between a common source line and a bit line, and a peripheral circuit coupled to the memory strings through a plurality of word lines and a dummy word line, and configured to set biases to the word lines and the dummy word line before performing a sensing operation, wherein the peripheral circuit applies a first pass voltage to the word lines concurrently with applying an initial voltage lower than the first pass voltage to the dummy word line, and increases the first pass voltage and the initial voltage to a second pass voltage to set the biases of the word lines and the dummy word line.

According to an embodiment, a semiconductor device may include memory strings coupled between a common source line and a bit line, and a peripheral circuit coupled to the memory strings through a plurality of word lines, and configured to set biases to the word lines before performing a sensing operation, wherein the peripheral circuit precharges at least one of the common source line and the bit line concurrently with applying a first pass voltage to the word lines before the peripheral circuit increases the first pass voltage to a second pass voltage to set the biases of the word lines.

BRIEF DESCRIPTION OF THE DRAWINGS

FIG. 5 is a flowchart illustrating a method of operating a semiconductor device;

FIGS. 6A to 6C are diagrams illustrating a method of operating a semiconductor device according to an embodiment;

FIGS. 7A to 7C are diagrams illustrating a method of operating a semiconductor device according to an embodiment;

DETAILED DESCRIPTION

Hereinafter, various examples of embodiments will be described with reference to the accompanying drawings. In the following description, a detailed explanation of related functions and constitutions may be omitted for simplicity and conciseness. In addition, the present disclosure may be embodied in different forms and should not be construed as limited to the embodiments set forth herein. Rather, these embodiments are provided so that this disclosure will be thorough and complete, and will fully convey the scope of the example embodiments to those skilled in the art.

It is also noted that in this specification, "connected/coupled" refers to one component not only directly coupling another component but also indirectly coupling another component through an intermediate component. In the specification, when an element is referred to as "comprising"

or "including" a component, it does not exclude other components but may further include other components unless a description to the contrary is specifically pointed out in context.

Various embodiments may be directed to a semiconductor device with improved operational characteristics, and an operating method of the semiconductor device.

Figure 1:
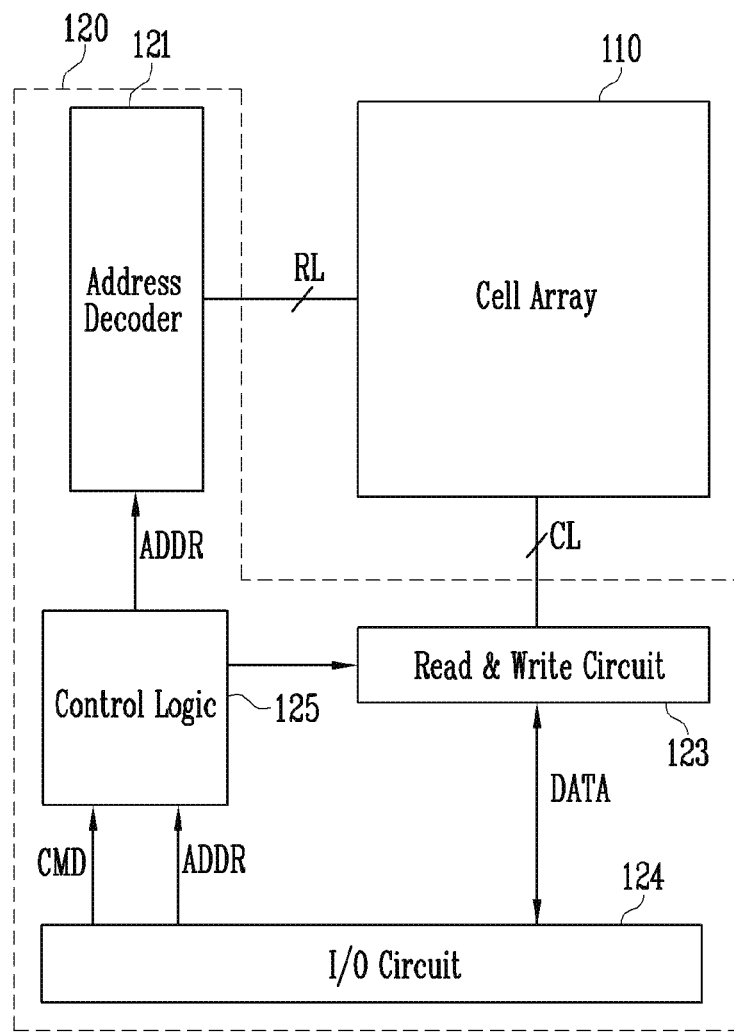
FIG. 1 is a block diagram illustrating the configuration of a semiconductor device according to an embodiment.

FIG. 1 is a block diagram illustrating the configuration of a semiconductor device 100 according to an embodiment. Referring to FIG. 1, the semiconductor device 100 may include a cell array 110 and a peripheral circuit 120.

The cell array 110 may be coupled to an address decoder 121 through row lines RL and to a read and write circuit 123 through column lines CL. The row lines RL may be word lines, and the column lines CL may be bit lines. The terms word lines and bit lines may be relative to each other. In other words, row lines may be the bit lines, and column lines may be the word lines. In an embodiment the row lines RL may be word lines, source select lines SSL, drain select lines DSL, and dummy word lines S_DWL and D_DWL.

The cell array 110 may include a plurality of memory strings, and the plurality of memory strings may be arranged in a horizontal direction or a vertical direction to a substrate. In addition, the cell array 110 may include a plurality of memory blocks, and each of the plurality of memory blocks may include a plurality of pages. For example, the semiconductor device 100 may perform an erase operation in units of memory blocks and a program operation or a read operation in units of pages.

The peripheral circuit 120 may include the address decoder 121, the read and write circuit 123, an input/output circuit 124 and a control logic 125.

The control logic 125 may be coupled to the address decoder 121, the read and write circuit 123 and the input/output circuit 124. The control logic 125 may receive a command CMD and an address ADDR from the input/output circuit 124 and control the address decoder 121 and the read and write circuit 123 to perform an internal operation in response to the received command CMD.

The address decoder 121 may be coupled to the cell array 110 through the row lines RL. For example, the address decoder 121 may be coupled to the cell array 110 through the word line, a dummy word line, a source select line, and a drain select line. In addition, the address decoder 121 may be configured to control the row lines RL in response to control of the control logic 125. Therefore, the address decoder 121 may receive the address ADDR from the control logic 125 and select one of the memory blocks of the cell array 110 in accordance with the received address ADDR.

A program operation and a read operation of the semiconductor device 100 may be performed in units of pages. Therefore, during the program operation and the read operation, the address ADDR may include a block address and a row address. The address decoder 121 may decode the block address included in the received address ADDR and select one of the memory blocks according to the decoded block address. The address decoder 121 may decode the row address included in the received address ADDR and select one of the pages of the selected memory block according to the decoded row address.

An erase operation of the semiconductor device 100 may be performed in units of memory blocks. Therefore, during the erase operation, the address ADDR may include a block address. The address decoder 121 may decode the block address, and select one memory block according to the decoded block address.

The read and write circuit 123 may be coupled to the cell array 110 through the column lines CL. During a program operation, the read and write circuit 123 may transfer data DATA received from the input/output circuit 124 to the column lines CL, and memory cells of the selected page may be programmed with the transferred data DATA. The data DATA may be multi-bit data to be programmed to memory cells, respectively. During a read operation, the read and write circuit 123 may read the data DATA from the memory cells of the selected page through the column lines CL and output the read data DATA to the input/output circuit 124. During an erase operation, the read and write circuit 123 may float the column lines CL. A program operation and an erase operation may include a verify operation, and the verify operation may be similarly performed to the read operation.

According to the configuration as described above, the memory cells may be programmed by a Single Level Cell (SLC) method or a Multi Level Cell (MLC) method. In addition, the control logic 125 may control the semiconductor device 100 to perform a program operation by a multi-step method. The multi-step method may perform a program operation a plurality of times to configure a desired program state, and may be a pre-/main program method, a reprogram method, a shadow program method, and the like.

The control logic 125 may control the address decoder 121 and the read and write circuit 123 to set bias of word lines, a dummy word line, and the like before sensing, when performing a read operation. For example, the peripheral circuit 120 may apply a first pass voltage to unselected word lines, an initial voltage lower than the first pass voltage to a dummy word line, and increase the first pass voltage and the initial voltage to a second pass voltage to set bias of the word lines and the dummy word line. In other examples, the peripheral circuit 120 may increase a first pass voltage to a second pass voltage to set bias of word lines after the peripheral circuit 120 applies the first pass voltage to unselected word lines and precharges at least one of a common source line and a bit line. In other examples, bias of word lines may be set by increasing a first pass voltage to a second pass voltage after applying the first pass voltage to unselected word lines and floating at least one of a common source line and a bit line.

According to this control method, an introduction path of a carrier may be mitigated even when a lateral electric field is formed when the bias of the word line is set. In other words, introduction of electrons from the common source line or the bit line into a channel region of a string may be mitigated. Therefore, Hot Carrier Injection (HCI) may be mitigated and read disturbance may be decreased. For example, read disturbance of a memory cell disposed adjacent to a source select transistor may be decreased. Thereby, read characteristics of a semiconductor device may be improved and reliability of data may be increased.

Figure 2:
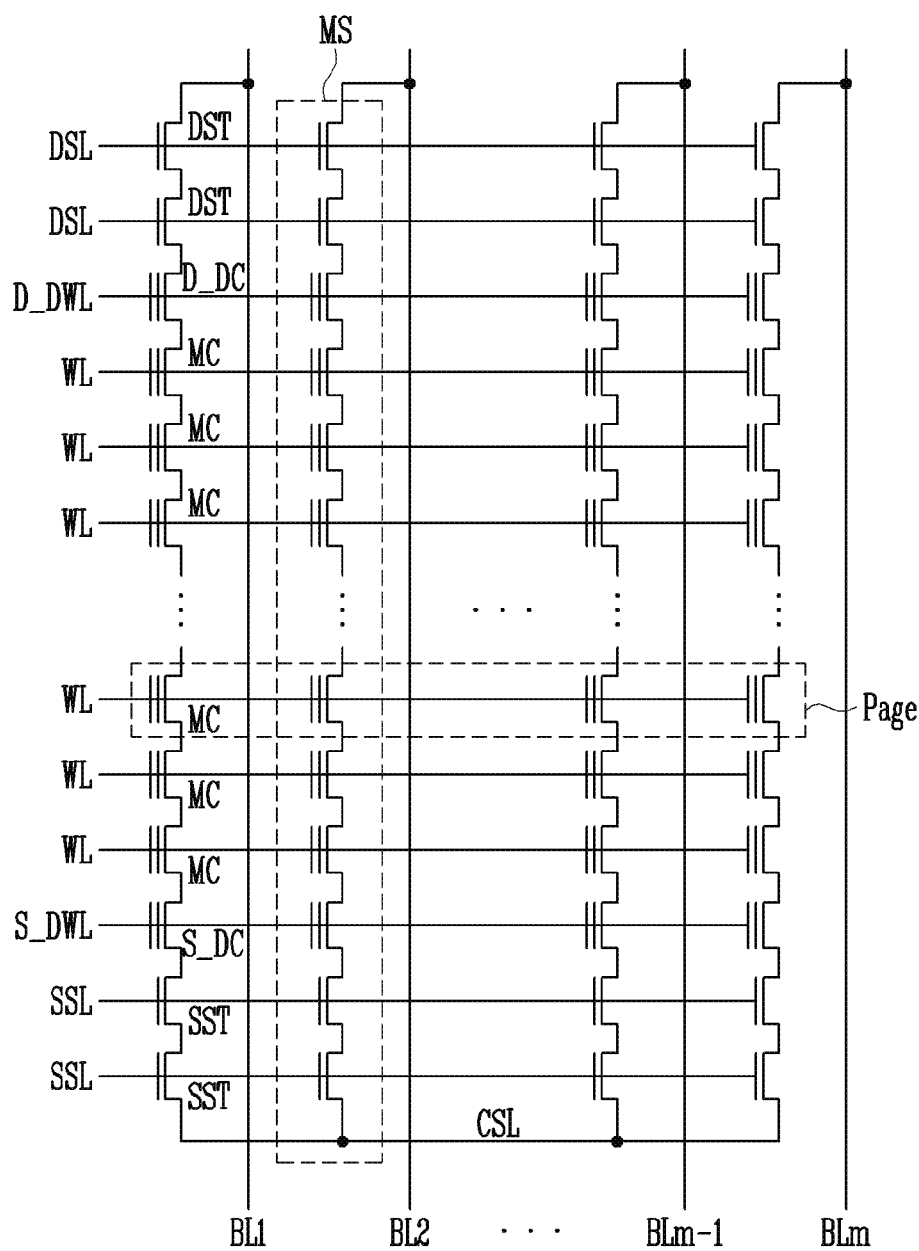
FIGS. 2 to 4 are circuit diagrams illustrating a cell array structure of a semiconductor device according to an embodiment.
Figure 3:
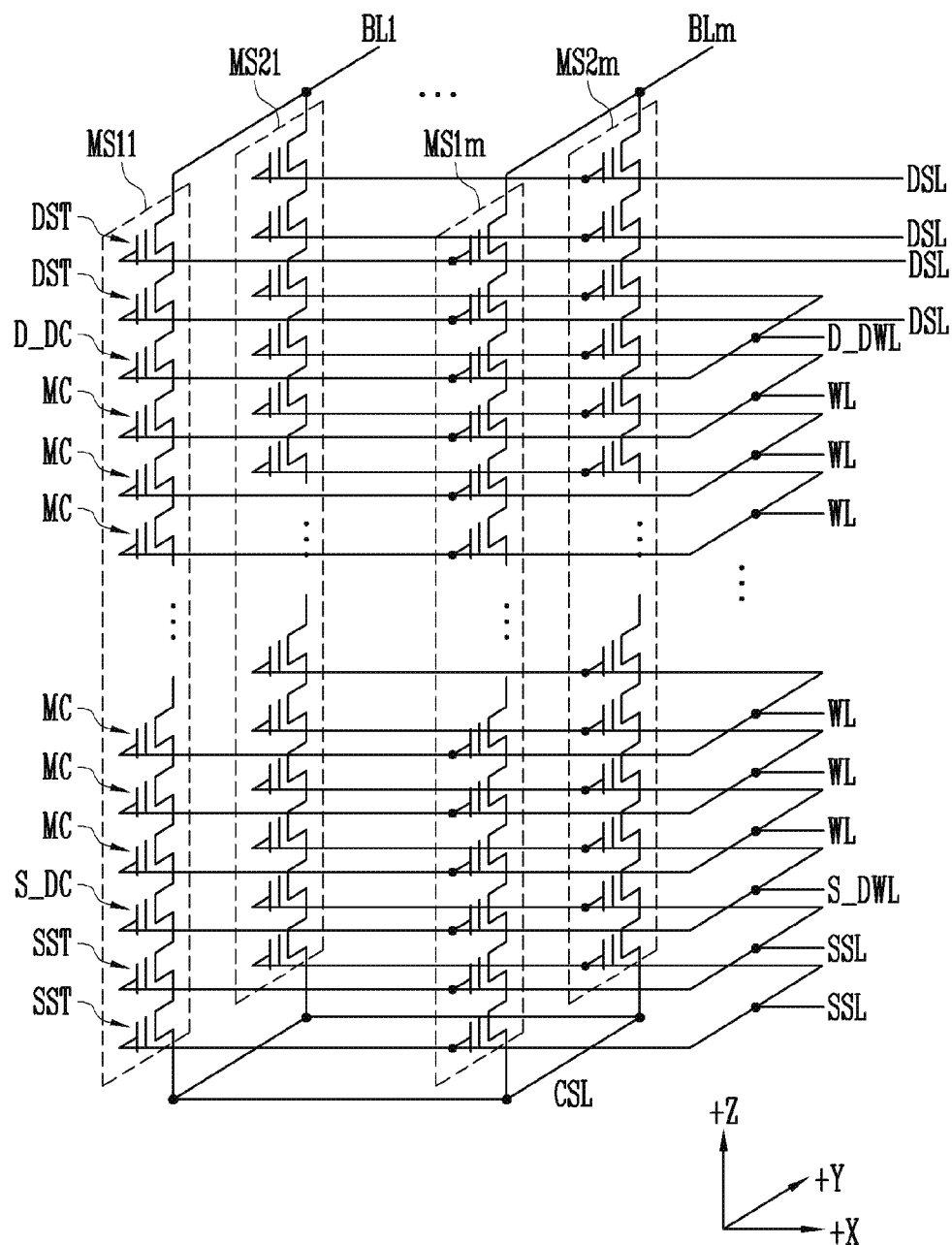
Figure 4:
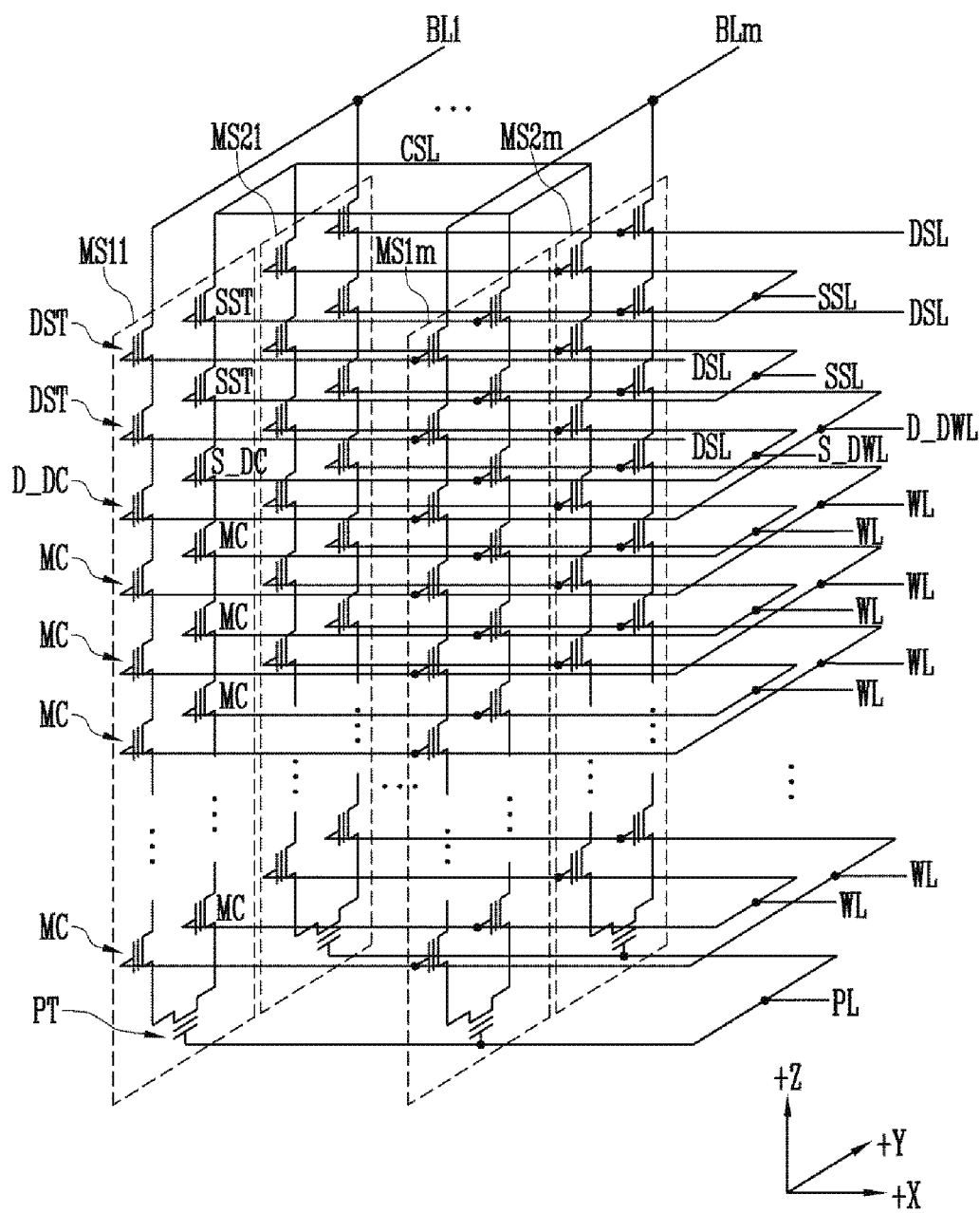

FIGS. 2 to 4 are circuit diagrams illustrating a cell array structure of a semiconductor device according to an embodiment.

FIG. 2 illustrates an embodiment in which memory strings MS are arranged in two dimensions. A cell array may include a plurality of memory blocks BLK, and each of the memory blocks BLK may include memory cells MC arranged in two dimensions.

Referring to FIG. 2, the memory block BLK may include the plurality of memory strings MS, and the plurality of memory strings MS may be coupled between bit lines BL1 to BLm and a common source line CSL. Each of the memory strings MS may include at least one drain select transistor DST, the plurality of memory cells MC and at least one source select transistor SST coupled in series with each other. Here, m may be an integer of 2 or more.

In addition, each of the memory strings MS may further include at least one drain side dummy memory cell D_DC coupled between the drain select transistor DST and the memory cells MC, further include at least one source side dummy memory cell S_DC coupled between the source select transistor SST and the memory cells MC, or further include the drain side dummy memory cell D_DC and the source side dummy memory cell S_DC. The dummy memory cell D_DC or S_DC may have a similar structure to the memory cell MC. For example, the dummy memory cell D_DC or S_DC may include a memory layer for storing data and the memory layer may include a tunnel insulating layer, a data storage layer, and a charge blocking layer.

Gate electrodes of the memory cells MC may be coupled to word lines WL. Word line voltages (such as a program voltage, a pass voltage, a read voltage) used for driving may be applied to each of the word lines WL. Gate electrodes of the drain side dummy memory cells D_DC may be coupled to a drain side dummy word line D_DWL. Gate electrodes of the source side dummy memory cells S_DC may be coupled to a source side dummy word line S_DWL. Word line voltages (such as a program voltage, a pass voltage, a read voltage) used for driving or an initial voltage may be applied to each of the dummy word lines D_DWL or S_DWL. Gate electrodes of the drain select transistors DST may be coupled to a drain select line DSL. Gate electrodes of the source select transistors SST may be coupled to a source select line SSL.

According to the structure as described above, the memory cells MC coupled to the same word line WL and simultaneously programmed may constitute one page, and one memory block BLK may include a plurality of pages Page.

FIG. 3 illustrates an embodiment in which the memory strings MS are arranged in three dimensions. A cell array may include the plurality of memory blocks BLK, and each of the memory blocks BLK may include the memory cells MC arranged in three dimensions.

Referring to FIG. 3, the memory block BLK may include a plurality of memory strings MS11 to MS1$m$ and MS21 to MS2$m$ coupled between the bit lines BL1 to BLm and the common source line CSL. Each of the memory strings MS11 to MS1$m$ and MS21 to MS2$m$ may extend in a +Z direction. The +Z direction may be a direction in which the memory cells MC are stacked. Here, m may be an integer of 2 or more.

Each of the memory strings MS11 to MS1$m$ and MS21 to MS2$m$ may include at least one source select transistor SST, the plurality of memory cells MC, and at least one drain select transistor DST that are sequentially stacked on each other. In addition, each of the memory strings MS11 to MS1$m$ and MS21 to MS2$m$ may further include at least one drain side dummy memory cell D_DC coupled between the drain select transistor DST and the memory cells MC, at least one source side dummy memory cell S_DC coupled between the source select transistor SST and the memory cells MC, or the drain side dummy memory cell D_DC and the source side dummy memory cell S_DC. The number, the location, and the like of dummy memory cells D_DC and S_DC included in each of the memory strings MS11 to MS1$m$ and MS21 to MS2$m$ may be changed. For example, the number of drain side dummy memory cells D_DC and the number of source side dummy memory cells S_DC included in a single memory string among the memory strings MS11 to MS1$m$ and MS21 to MS2$m$ may be the same as or different from each other.

The source select transistors SST included in a single memory string among the memory strings MS11 to MS1$m$ and MS21 to MS2$m$ may be coupled between the source side dummy memory cell S_DC and the common source line CSL in series. In addition, the source select transistors SST in the same level may be coupled to the same source select line SSL.

The source side dummy memory cell S_DC included in a single memory string among the memory strings MS11 to MS1$m$ and MS21 to MS2$m$ may be coupled between the memory cells MC and the source select transistors SST in series. In addition, the source side dummy memory cells S_DC which are disposed in the same level may be coupled to the same source side dummy word line S_DWL.

The drain side dummy memory cell D_DC included in a single memory string among the memory strings MS11 to MS1$m$ and MS21 to MS2$m$ may be coupled between the memory cells MC and the drain select transistors DST in series. In addition, the drain side dummy memory cells D_DC which are disposed in the same level may be coupled to the same drain side dummy word line D_DWL.

The memory cells MC included in a single memory string among the memory strings MS11 to MS1$m$ and MS21 to MS2$m$ may be coupled between the source side dummy memory cell S_DC and the drain side dummy memory cell D_DC in series. In addition, the memory cells MC in the same level may be coupled to the same word line WL.

The drain select transistors DST included in a single memory string among the memory strings MS11 to MS1$m$ and MS21 to MS2$m$ may be coupled between the bit lines BL1 to BLm and the drain side dummy memory cell D_DC in series. The drain select transistors DST in the same level among the drain select transistors DST of the memory strings MS11 to MS1$m$ and MS21 to MS2$m$ arranged in the same row (in a +X direction) may be coupled to the same drain select line DSL. In addition, the drain select transistors DST arranged in different rows (in the +X direction) may be coupled to the different drain select lines DSL from each other.

FIG. 4 illustrates an embodiment in which the memory strings MS are arranged in three dimensions. A cell array may include the plurality of memory blocks BLK, and each of the memory blocks BLK may include the memory cells MC arranged in three dimensions.

Referring to FIG. 4, the memory block BLK may include the plurality of memory strings MS11 to MS1$m$ and MS21 to MS2$m$. Each of the memory strings MS11 to MS1$m$ and MS21 to MS2$m$ may include at least one source select transistor SST, at least one source side dummy memory cell S_DC, the plurality of memory cells MC, at least one pipe transistor PT, the plurality of memory cells MC, at least one drain side dummy memory cell D_DC, and at least one drain select transistor DST that are coupled to each other in series. Each of the memory strings MS11 to MS1$m$ and MS21 to MS2$m$ may be arranged in the shape of U.

The pipe transistor PT may couple the memory cells MC of the drain side and the memory cells MC of the source side. In addition, a gate of the pipe transistor PT of each of the memory strings MS11 to MS1$m$ and MS21 to MS2$m$ may be coupled to a pipe line PL.

Structures other than the structures described above with reference to FIG. 4 are similar to the structures as described with reference to FIG. 3. Therefore, repetitive descriptions are omitted here.

FIG. 5 is a flowchart illustrating a method of operating a semiconductor device. The semiconductor device may include the cell array described above with reference to FIGS. 2, 3 and 4. For example, the memory strings MS may be coupled between the common source line CSL and the bit line BL, and each of the memory strings MS may include the memory cells MC, the select transistors DST and SST, and at least one dummy memory cell D_DC or S_DC coupled between the plurality of memory cells MC and the plurality of select transistors DST and SST.

Referring to FIG. 5, bias of the word lines WL may be set at step S510. For example, the peripheral circuit 120 or the control logic 125 may control the semiconductor device 100 to set bias of the word lines WL and the dummy word lines D_DWL and S_DWL. In other examples, the peripheral circuit 120 or the control logic 125 may control the semiconductor device 100 to set bias of the word lines WL, the dummy word lines D_DWL and S_DWL, and the common source line CSL, or to set bias of the word lines WL, the dummy word lines D_DWL and S_DWL, and the bit line BL.

Subsequently, at step S520, data may be read from the selected memory cell MC of the selected memory string MS among the memory strings MS by sensing voltages. For example, the peripheral circuit 120 or the control logic 125 may control the semiconductor device 100 to read data from selected memory cells.

Figure 6B:
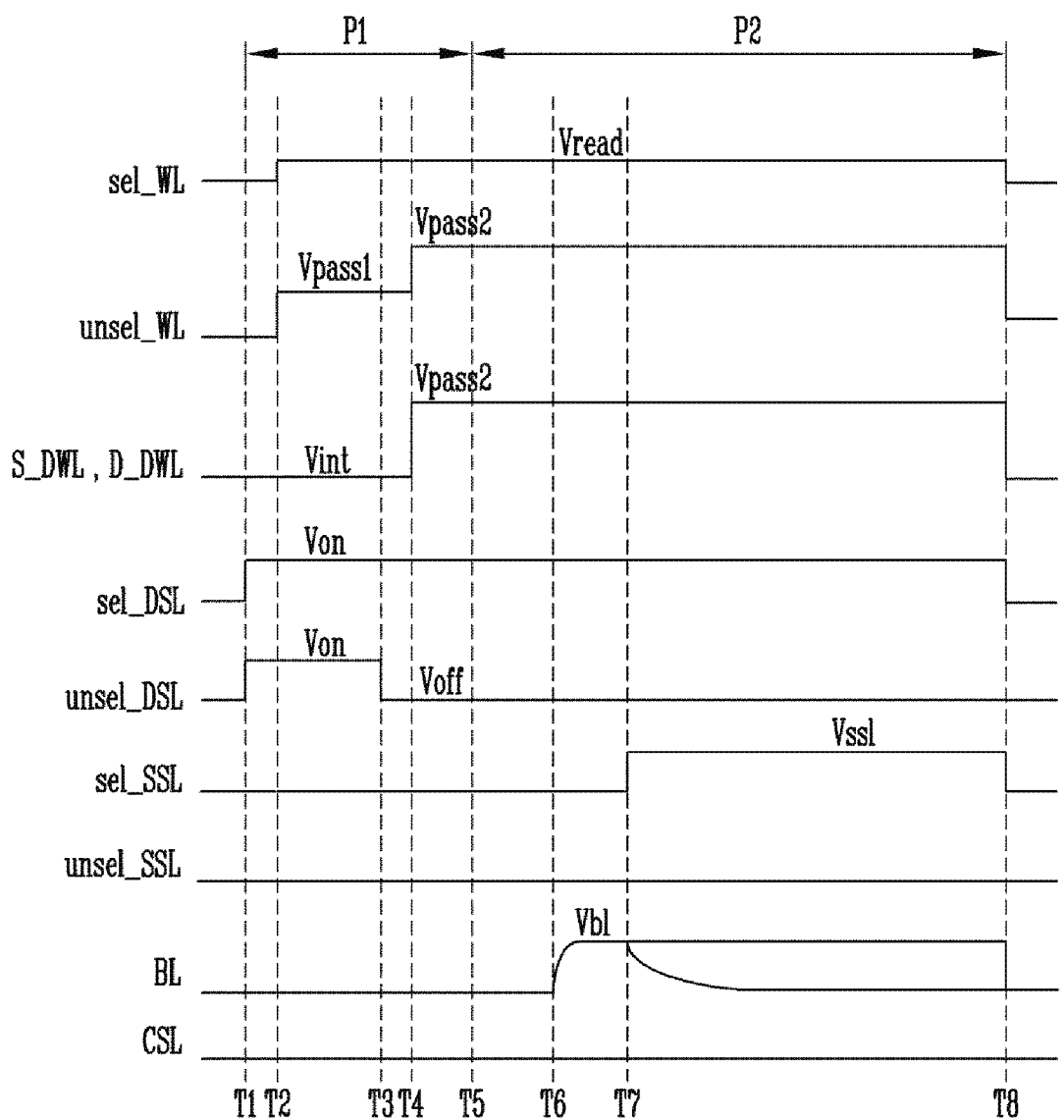

FIGS. 6A to 6C are diagrams illustrating a method of operating a semiconductor device according to an embodiment. FIG. 6A is a flowchart illustrating a method of setting bias, and FIGS. 6B and 6C are timing diagrams of a read operation.

Referring to FIG. 6A, a first pass voltage may be applied to unselected word lines and an initial voltage may be applied to a dummy word line at step S610. The initial voltage may have a lower level than the first pass voltage and may be a ground voltage. In addition, the first pass voltage may be applied to a selected word line.

Subsequently, the first pass voltage and the initial voltage may be increased to a second pass voltage at step S620. The second pass voltage may turn on memory cells independent of threshold voltages of the memory cells.

Thereby, the bias of the word lines (i.e., the selected word line sel_WL, the unselected word lines unsel_WL, and the dummy word lines S_DWL and D_DWL) may be set and subsequently, a sensing operation on selected memory cells of selected memory strings may be performed.

According to the method of setting bias described above, the initial voltage may be applied to dummy word lines when the first pass voltage is applied to unselected word lines. Accordingly, an introduction path of a carrier may be mitigated even when a lateral electric field is formed when the bias is set before sensing. Accordingly, hot carrier injection (HCI) may be mitigated and read disturbance may be decreased.

Referring to FIG. 6B, after the bias of the word lines is set during a first period P1, data stored in the selected memory cells may be sensed during a second period P2.

First, an initial voltage Vint may be applied to the dummy word lines S_DWL and D_DWL at a first time T1. For example, the initial voltage Vint may be applied to the source side dummy word line S_DWL, the drain side dummy word line D_DWL, or the source side dummy word line S_DWL and the drain side dummy word line D_DWL. The initial voltage Vint may be a low voltage lower than the first pass voltage Vpass1 or a ground voltage. Thereby, dummy transistors may be turned off.

A turn-on voltage Von may be applied to selected drain select lines sel_DSL and unselected drain select lines unsel_DSL. Thereby, drain select transistors included in the memory strings may be turned on and selected memory strings and an unselected memory string may be electrically coupled to the bit lines BL.

A ground voltage may be applied to selected source select lines sel_SSL and unselected source select lines unsel_SSL. Source select transistors included in the memory strings may be turned off and the memory strings may be electrically separated from the common source line CSL.

At a second time T2, a read voltage Vread may be applied to a selected word line sel_WL among the word lines WL, and a first pass voltage Vpass1 may be applied to unselected word lines unsel_WL among the word lines WL. The first pass voltage Vpass1 may have the substantially same level as the read voltage Vread or a higher level than the read voltage Vread. However, the first pass voltage Vpass1 may have a lower level than a second pass voltage Vpass1 to be applied later. Accordingly, even when the first pass voltage Vpass 1 is applied, some memory cells having a high threshold voltage may have a turn-off state. Because channel regions of the memory strings are in a floating state, and a channel boosting is temporarily induced, a lateral electric field may be formed. When a carrier may be introduced from the common source line CSL or the bit line BL, read disturbance may occur by HCI. For example, memory cells adjacent to the common source line CSL and the bit line BL may be vulnerable to read disturbance.

Accordingly, according to an embodiment, the first pass voltage Vpass1 may be applied to the unselected word lines unsel_WL in a state in which the initial voltage Vint is applied to the dummy word lines S_DWL and D_DWL. Because dummy transistors are in a turn-off state, a carrier might not be introduced from the common source line CSL or the bit line BL to the channel regions of the memory strings. Accordingly, read disturbance induced by HCI may be mitigated even when memory cells having a high threshold voltage have a turn-off state.

At a third time T3, a turn-off voltage Voff may be applied to the unselected drain select line unsel_DSL. Thereby, drain select transistors of the memory strings coupled to the unselected drain select line unsel_DSL may be turned off and the unselected memory strings may be electrically separated from the bit lines BL. Accordingly, channel regions of the unselected memory strings may be floated.

The selected drain select line sel_DSL may be maintained at the turn-on voltage Von. Accordingly, the selected memory strings may be maintained in a state in which the selected memory strings are electrically coupled to the bit lines BL.

At a fourth time T4, the first pass voltage Vpass1 and the initial voltage Vint may be increased to the second pass voltage Vpass2. Thereby, potentials of channel regions of the unselected memory strings may be boosted by coupling with voltages of the word lines sel_WL and unsel_WL and the dummy word lines S_DWL and D_DWL. For example, potentials of the channel regions of the unselected memory strings may be boosted according to increase from the first pass voltage Vpass1 to the second pass voltage Vpass2. Accordingly, the channel regions of the unselected memory strings may be set to boosted voltages.

Thereby, the first period P1 may end and a bias setting of the selected word line sel_WL, the unselected word lines unsel_WL, and the dummy word lines S_DWL and D_DWL may be completed. In other words, the channel regions of the memory strings may be set before sensing.

At a fifth time T5, a voltage of the selected word line sel_WL may be maintained at the read voltage Vread. Voltages of the unselected word lines unsel_WL and the dummy word lines S_DWL and D_DWL may be maintained at the second pass voltage Vpass2. Accordingly, the channel regions of the unselected memory strings may be maintained at the boosted voltages during a read operation.

Subsequently, a sensing operation may be variously performed. For example, the read and write circuit 123 may precharge the bit line BL, and may determine data of a selected memory cell depending on whether the selected memory cell discharges the precharged voltage after precharge ends. In other examples, the read and write circuit 123 may continuously supply a current to a bit line, and may determine data of a selected memory cell depending on whether the selected memory cell passes the current continuously supplied.

At a sixth time T6, the bit lines BL may be charged by a bit line voltage Vbl. The read and write circuit 123 may charge the bit lines BL in response to control of the control logic 125.

At a seventh time T7, a source select line voltage Vssl may be applied to the selected source select line sel_SSL. The source select line voltage Vssl may have the substantially same level as the turn-on voltage Von or a different level from the turn-on voltage Von. Source select transistors of the memory strings which are coupled to the selected source select line sel_SSL may be turned on in accordance with the source select line voltage Vssl. Accordingly, the selected memory strings may be electrically coupled to the common source line CSL.

When a threshold voltage of a selected memory cell is greater than the read voltage Vread, the selected memory cell may be turned off, and when a threshold voltage of a selected memory cell is less than the read voltage Vread, the selected memory cell may be turned on in each of the selected memory strings. Unselected memory cells may be turned on independent of a threshold voltage in each of the selected memory strings.

Depending on whether the selected memory cell is turned on, the bit line voltage Vbl of the corresponding bit line BL may be discharged to the common source line CSL through the corresponding memory string. When a threshold voltage of the selected memory cell is less than the read voltage Vread, the bit line voltage Vbl may be discharged to the common source line CSL through the corresponding memory string. When a threshold voltage of the selected memory cell is greater than the read voltage Vread, the bit line voltage Vbl may be maintained.

The read and write circuit 123 may determine data of the selected memory cells by detecting changes in voltages of the bit lines BL.

At an eighth time T8, voltages of the selected drain select line sel_DSL, the word lines sel_WL, unsel_WL, S_DWL, and D_DWL, and the selected source select line sel_SSL may be discharged to a ground voltage to end the read operation.

FIG. 6C is similar to FIG. 6B as described above, and relates to an embodiment of setting bias of the selected word line sel_WL in a similar manner to the unselected word line unsel_WL during the first period P1.

First, the initial voltage Vint may be applied to the dummy word lines S_DWL and D_DWL at the first time T1. The turn-on voltage Von may be applied to the selected drain select lines sel_DSL and the unselected drain select lines unsel_DSL. A ground voltage may be applied to the selected source select lines sel_SSL and the unselected source select lines unsel_SSL.

At the second time T2, the first pass voltage Vpass1 may be applied to the selected word line sel_WL and the unselected word lines unsel_WL. At the third time T3, the turn-off voltage Voff may be applied to the unselected drain select line unsel_DSL. The selected drain select line sel_DSL may be maintained at the turn-on voltage Von. At the fourth time T4, the first pass voltage Vpass1 and the initial voltage Vint may be increased to the second pass voltage Vpass2.

The voltage of the selected word line sel_WL may be decreased from the second pass voltage Vpass2 to the ground voltage between the fourth time T4 and the fifth time T5. Thereby, the selected word line sel_WL may be discharged before the second period P2.

At the fifth time T5, the read voltage Vread may be applied to the selected word line sel_WL. For example, a voltage of the selected word line sel_WL may be decreased from the second pass voltage Vpass2 to the ground voltage, and then increased to the read voltage Vread. In other examples, a voltage of the selected word line sel_WL may be decreased from the second pass voltage Vpass2 directly to the read voltage Vread.

Operations during the sixth, seventh, and eighth times T6, T7, and T8 may be similarly performed to the operations described with reference to FIG. 6B. At the sixth time T6, the bit lines BL may be precharged to the bit line voltage Vbl, and at the seventh time T7, the source select line voltage Vssl may be applied to the selected source select line sel_SSL. The bit line voltage Vbl of the bit lines BL may be maintained or decreased depending on a threshold voltage of the selected memory cells and the read operation may end at the eighth time T8.

According to the operating method as described above, the first pass voltage Vpass1 may be applied to the unselected word lines unsel_WL in a state in which the initial voltage Vint is applied to the dummy word lines S_DWL and D_DWL. Accordingly, introduction of a carrier from the common source line CSL and the bit line BL into the channel regions of the memory strings may be mitigated by dummy transistors which are turned off. In other words, read disturbance caused by HCI may be mitigated.

Figure 7A:
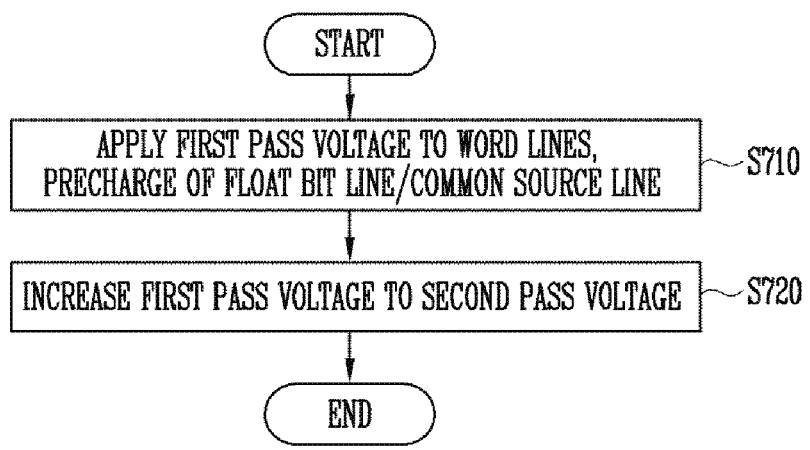
Figure 7C:
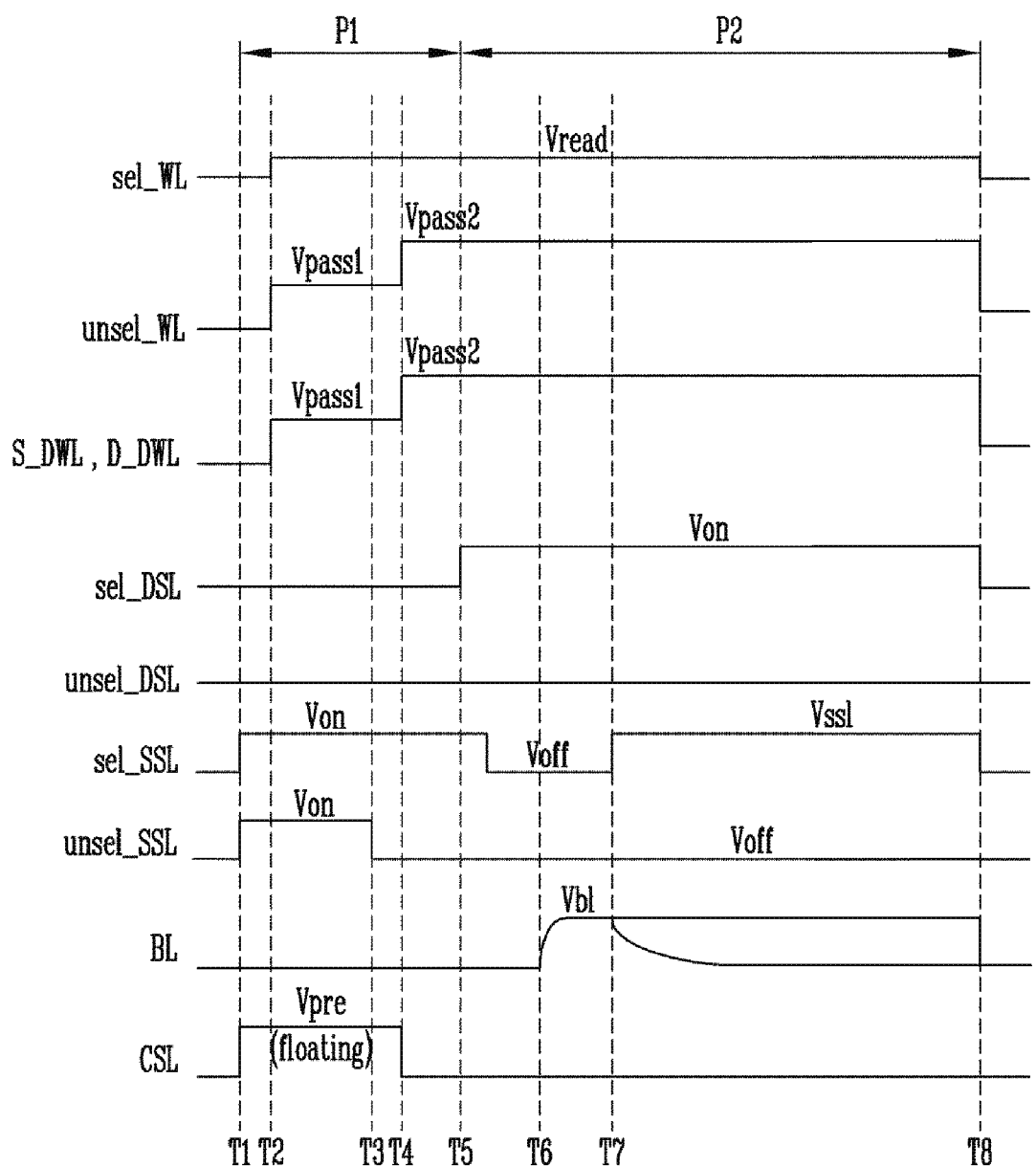

FIGS. 7A to 7C are diagrams illustrating a method of operating a semiconductor device according to an embodiment. FIG. 7A is a flowchart illustrating a method of setting bias, and FIGS. 7B and 7C are timing diagrams of a read operation. Hereinafter, any repetitive detailed description of components already mentioned above will be omitted.

Referring to FIG. 7A, the first pass voltage may be applied to the unselected word lines and the common source line or the bit line may be precharged or floated at step S710. The first pass voltage or the initial voltage may be applied to the dummy word lines as well. In addition, the first pass voltage or the initial voltage may be applied to the selected word line as well.

Subsequently, the first pass voltage may be increased to the second pass voltage at step S720. The second pass voltage may turn on the memory cells independent of threshold voltages of the memory cells. When the initial voltage is applied to the dummy word lines, the initial voltage may be increased to the second pass voltage.

Thereby, the bias of the word lines may be set and subsequently, a sensing operation on the selected memory cells of the selected memory strings may be performed.

According to the method of setting the bias as described above, the bit line or the common source line may be precharged or floated when the first pass voltage is applied to the unselected word lines. When the bit line is precharged or floated, introduction of a carrier from the bit line into the channel regions of the memory strings may be blocked or decreased during a process of setting bias. In addition, when the common source line is precharged or floated, introduction of a carrier from the common source line into the channel regions of the memory strings during a process of setting bias may be blocked or decreased.

Referring to FIG. 7B, after the bias of the word lines and the bit line is set during the first period P1, data stored in the selected memory cells may be sensed during the second period P2.

First, a precharge voltage Vpre may be applied to the bit lines BL at the first time T1. Alternatively, the bit lines BL may be floated.

The turn-on voltage Von may be applied to the selected drain select lines sel_DSL and the unselected drain select lines unsel_DSL. Accordingly, the drain select transistors included in the memory strings may be turned on, and the selected memory strings and the unselected memory strings may be electrically coupled to the bit lines BL.

The ground voltage may be applied to the selected source select lines sel_SSL and the unselected source select lines unsel_SSL. Source select transistors included in the memory strings may be turned off and the memory strings may be electrically separated from the common source line CSL.

At the second time T2, the read voltage Vread may be applied to the selected word line sel_WL among the word lines WL, and the first pass voltage Vpass1 may be applied to the unselected word lines unsel_WL and the dummy word lines S_DWL and D_DWL among the word lines WL. The first pass voltage Vpass1 may have the substantially same level as the read voltage Vread or a higher level than the read voltage Vread.

The first pass voltage Vpass1 may be applied to the unselected word lines unsel_WL and the dummy word lines S_DWL and D_DWL in a state in which the bit lines BL are precharged. The drain select transistor and the memory cells may be turned on and the precharge voltage Vpre of the bit lines BL may be transferred to the channel region of the memory string. Accordingly, a lateral electric field may be weakened and introduction of a carrier from the bit lines BL may be mitigated.

At the third time T3, the turn-off voltage Voff may be applied to the unselected drain select line unsel_DSL. Thereby, the drain select transistors of the memory strings which are coupled to the unselected drain select line unsel_DSL may be turned off and the unselected memory strings may be electrically separated from the bit lines BL. Accordingly, the channel regions of the unselected memory strings may be floated.

The selected drain select line sel_DSL may be maintained at the turn-on voltage Von. Accordingly, the selected memory strings may be maintained in a state in which the selected memory strings are electrically coupled to the bit lines BL.

At the fourth time T4, the voltage of the bit lines BL may be discharged from the precharge voltage Vpre to reach the ground voltage. In addition, the first pass voltage Vpass1 applied to the unselected word lines unsel_WL and the dummy word lines S_DWL and D_DWL may be increased to the second pass voltage Vpass2. Thereby, potentials of the channel regions of the unselected memory strings may be boosted by coupling with the voltages of the word lines sel_WL and unsel_WL and the dummy word lines S_DWL and D_DWL. Accordingly, the channel regions of the unselected memory strings may be set to boosted voltages.

Thereby, the first period P1 may end and a bias setting of the selected word line sel_WL, the unselected word lines unsel_WL, the dummy word lines S_DWL and D_DWL, and the bit line BL may be completed. In other words, the channel regions of the memory strings may be set before sensing.

At the fifth time T5, the voltage of the selected word line sel_WL may be maintained at the read voltage Vread, and the voltages of the unselected word lines unsel_WL and the dummy word lines S_DWL and D_DWL may be maintained at the second pass voltage Vpass2. Accordingly, the channel regions of the unselected memory strings may maintain the boosted voltages during a sensing operation.

Operations during the sixth, seventh, and eighth times T6, T7, and T8 may be similarly performed to the operations described with reference to FIG. 6B. At the sixth time T6, the bit lines BL may be precharged to the bit line voltage Vbl, and at the seventh time T7, the source select line voltage Vssl may be applied to the selected source select line sel_SSL. The bit line voltage Vbl of the bit lines BL may be maintained or decreased depending on a threshold voltage of the selected memory cells and the read operation may end at the eighth time T8.

FIG. 7C is similar to FIG. 7B and relates to an embodiment of precharging the common source line CSL instead of the bit line BL during the first period P1.

First, the precharge voltage Vpre may be applied to the common source line CSL at the first time T1. Alternatively, the common source line CSL may be floated. The turn-on voltage Von may be applied to the selected source select lines sel_SSL and the unselected source select lines unsel_SSL. Thereby, the source select transistors included in the memory strings may be turned on.

The ground voltage may be applied to the selected drain select lines sel_DSL and the unselected drain select lines unsel_DSL. Accordingly, drain select transistors included in the memory strings may be turned off and the memory strings may be electrically separated from the bit lines BL.

At the second time T2, the read voltage Vread may be applied to the selected word line sel_WL among the word lines WL, and the first pass voltage Vpass1 may be applied to the unselected word lines unsel_WL and the dummy word lines S_DWL and D_DWL among the word lines WL. The first pass voltage Vpass1 may have the substantially same level as the read voltage Vread or a higher level than the read voltage Vread.

At the third time T3, the turn-off voltage Voff may be applied to the unselected source select line unsel_SSL. Accordingly, the source select transistors of the unselected memory strings may be turned off and the channel regions of the unselected memory strings may be electrically separated from the common source line CSL. Because the channel regions of the unselected memory strings are electrically separated from the bit lines BL as well, the channel regions of the unselected memory strings may be floated. Because the selected source select line sel_SSL may be maintained at the turn-on voltage Von, the selected memory strings may maintain a state in which the selected memory strings are electrically coupled to the common source line CSL.

At the fourth time T4, the voltage of the common source line CSL may be discharged from the precharge voltage Vpre to reach the ground voltage. In addition, the voltages of the unselected word lines unsel_WL and the dummy word lines S_DWL and D_DWL may be increased from the first pass voltage Vpass1 to the second pass voltage Vpass2. Thereby, potentials of the channel regions of the unselected memory strings may be boosted according to increase from the first pass voltage to the second pass voltage. Accordingly, the channel regions of the unselected memory strings may be set to the boosted voltages before a sensing operation.

Because the selected source select line sel_SSL may be maintained at the turn-on voltage Von, the channel regions of the selected memory strings may maintain a state in which the channel regions of the selected memory strings are electrically coupled to the common source line CSL.

Thereby, the first period P1 may end and a bias setting of the selected word line sel_WL, the unselected word lines unsel_WL, the dummy word lines S_DWL and D_DWL, and the common source line CSL may be completed. In other words, the channel regions of the memory strings may be set before sensing.

At the fifth time T5, the turn-on voltage Von may be applied to the selected drain select line sel_DSL. Thereby, the drain select transistors of the selected memory strings may be turned on, and the selected memory strings may be electrically coupled to the bit lines BL. The unselected drain select line unsel_DSL may maintain a turn-off voltage, for example, a ground voltage.

The read voltage Vread may be applied to the selected word line sel_WL. Voltages of the unselected word lines unsel_WL and the dummy word lines S_DWL and D_DWL may be maintained at the second pass voltage Vpass2. Accordingly, the channel regions of the unselected memory strings may maintain the boosted voltages during a sensing operation.

The voltage of the selected source select line sel_SSL may be decreased from the turn-on voltage Von to the turn-off voltage Voff between the fifth time T5 and the sixth time T6. Thereby, the source select transistors of the selected memory strings may be turned off. The channel regions of the selected memory strings may be mitigated from being boosted by the second pass voltage Vpass2, by delaying a point at which the voltage of the selected source select line sel_SSL is decreased. The unselected source select line unsel_SSL may maintain the turn-off voltage Voff.

Operations during the sixth, seventh, and eighth times T6, T7, and T8 may be similarly performed to the operations described with reference to FIG. 6B. At the sixth time T6, the bit lines BL may be precharged to the bit line voltage Vbl, and at the seventh time T7, the source select line voltage Vssl may be applied to the selected source select line sel_SSL. The bit line voltage Vbl of the bit lines BL may be maintained or decreased depending on a threshold voltage of the selected memory cells and the read operation may end at the eighth time T8.

Although FIGS. 7B and 7C illustrate an example in which the read voltage Vread is applied to the selected word line sel_WL during the first period P1, the first pass voltage Vpass1 and the second pass voltage Vpass2 may be applied or the first pass voltage Vpass1, the second pass voltage Vpass2, and the ground voltage may be applied as described above with reference to FIG. 6C.

Figure 8:
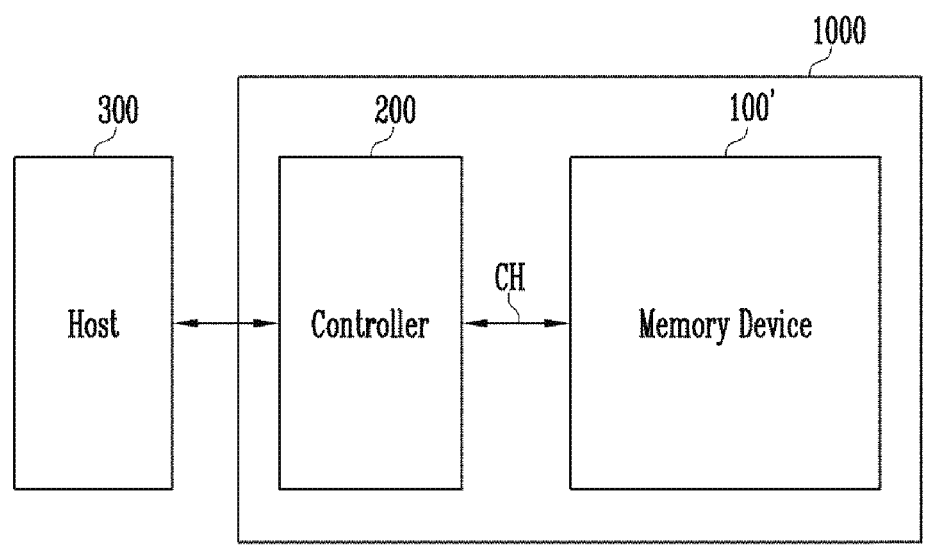
FIG. 8 is a block diagram illustrating the configuration of a memory system according to an embodiment.

FIG. 8 is a block diagram illustrating the configuration of a memory system 1000 according to an embodiment. Referring to FIG. 8, the memory system 1000 may include a memory device 100' and a controller 200.

The controller 200 may control the memory device 100' through a channel CH and the memory device 100' may operate in response to control of the controller 200. The memory device 100' may include a memory cell array including a plurality of memory blocks. According to an embodiment, the memory device 100' may be the semiconductor device 100 described above, or a Flash Memory Device.

The controller 200 may control the memory device 100' in response to a request from a host 300. In addition, the memory device 100' may receive a command and an address from the controller 200 through the channel CH and access an area selected from the memory cell array in response to the address. In other words, the memory device 100' may perform an internal operation corresponding to a command on the area selected by the address.

In addition, the controller 200 may control the memory device 100' to perform a program operation, a read operation, or an erase operation. During the program operation, the controller 200 may provide a program command, an address, and data to the memory device 100' through the channel CH, and the memory device 100' may program the area selected by the address with data. During the erase operation, the controller 200 may provide an erase command and an address to the memory device 100' through the channel CH, and the memory device 100' may erase data stored in the area selected by the address. During the read operation, the controller 200 may provide a read command and an address to the memory device 100' through the channel CH and the memory device 100' may read data from the area selected by the address. This read operation may include a read operation serving as verification entailed by a program or erase operation as well as a read operation performed to read and output data stored in a memory cell.

When the controller 200 receives a read operation requested from the host 300, the controller 200 may command that the memory device 100' may perform the read operation by the method described above with reference to FIGS. 5 to 7C. According to this method, read disturbance may be decreased and the reliability of data programmed to the memory cells may be ensured.

Figure 9:
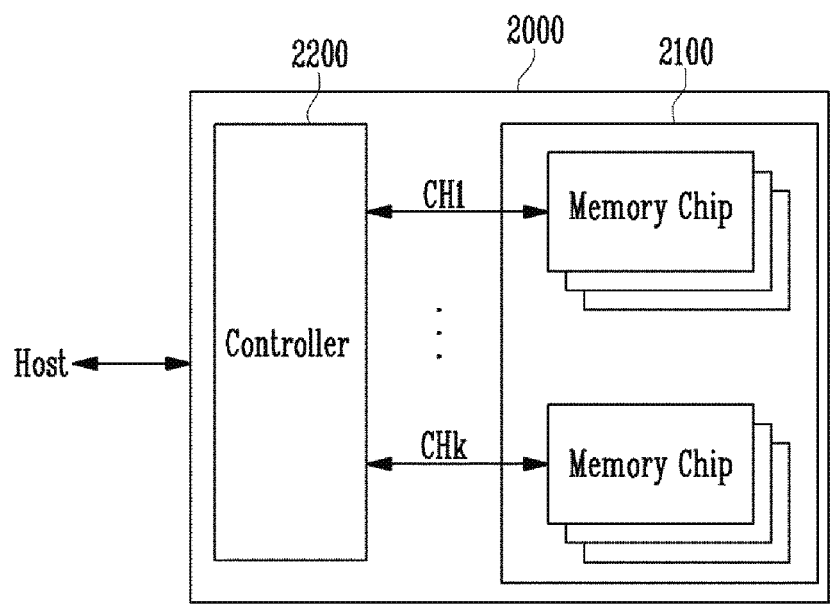
FIG. 9 is a block diagram illustrating the configuration of a memory system according to an embodiment.

FIG. 9 is a block diagram illustrating the configuration of a memory system 2000 according to an embodiment. Referring to FIG. 9, the memory system 2000 may include a memory device 2100 and a controller 2200.

The memory device 2100 may be a semiconductor device and include a plurality of memory chips. The plurality of memory chips may be divided into a plurality of groups. The plurality of groups may communicate with the controller 2200 through first to kth channels CH1 to CHk, respectively. Each of the memory chips may be configured and operated in a similar manner as the semiconductor devices 100 described above with reference to FIG. 1.

Each group may be configured to communicate with the controller 2200 through a single common channel. The controller 2200 may be configured in substantially the same manner as the controllers 200 described with reference to FIG. 8, and configured to control the plurality of memory chips of the memory device 2100 through the plurality of channels CH1 to CHk. The memory system 2000 may be modified so that a single memory chip may be coupled to a single channel.

The controller 2200 and the memory device 2100 may be integrated in one semiconductor device. According to an embodiment, the controller 2200 and the memory device 2100 may be integrated into a single semiconductor device to form a memory card. For example, the controller 2200 and the memory device 2100 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), a universal flash storage (UFS), and the like.

The controller 2200 and the memory device 2100 may be integrated in a single semiconductor device to form a Solid State Drive (SSD). The SSD may include a storage device for storing data in a memory. When the memory system 2000 serves as an SSD, operational rates of the host coupled to the memory system 2000 may be significantly improved.

In other examples, the memory system 2000 may be provided as one of various elements of an electronic device such as a computer, an Ultra Mobile PC (UMPC), a workstation, a net-book, Personal Digital Assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or one of various elements for forming a computing system, or the like.

Figure 10:
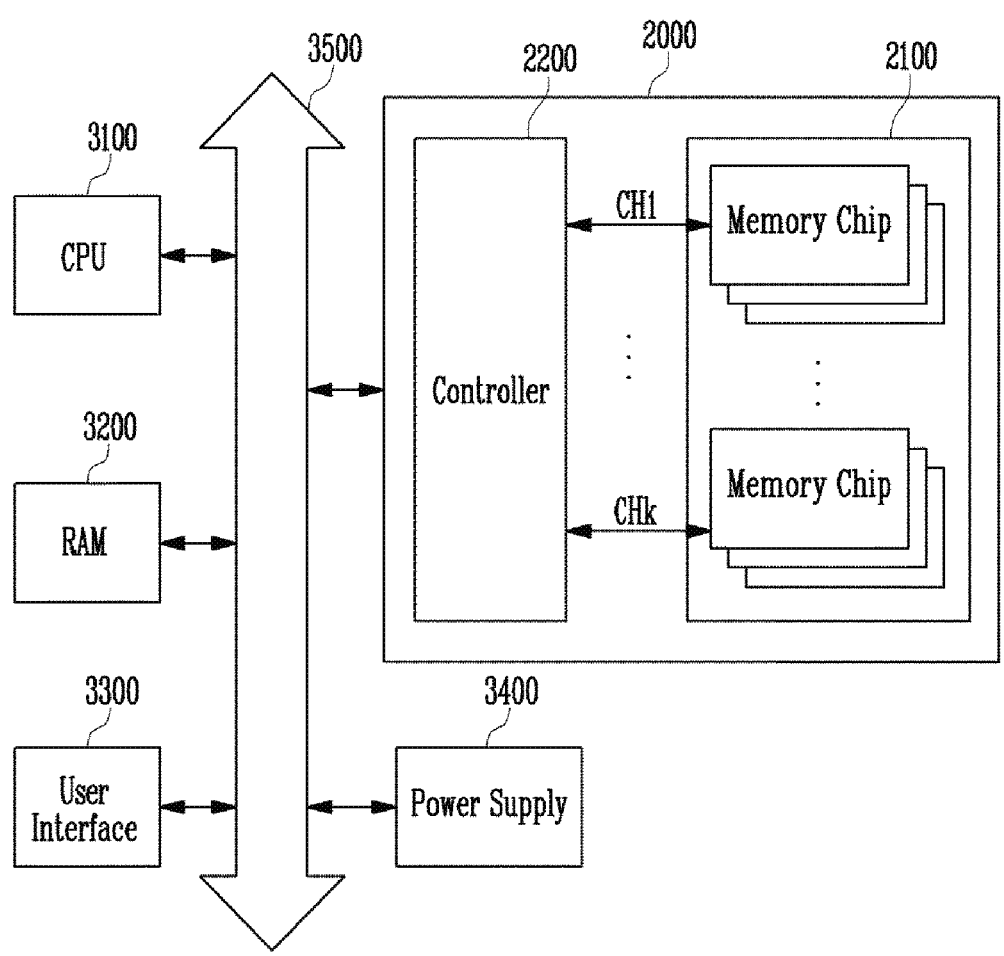
FIG. 10 is a block diagram illustrating the configuration of a computing system according to an embodiment.

FIG. 10 is a block diagram illustrating the configuration of a computing system 3000 according to an embodiment. Referring to FIG. 10, the computing system 3000 may include a central processing unit 3100, Random Access Memory (RAM) 3200, a user interface 3300, a power supply 3400, a system bus 3500, and the memory system 2000.

The memory system 2000 may be electrically coupled to the central processing unit 3100, the RAM 3200, the user interface 3300, and the power supply 3400 through the system bus 3500. Data provided through the user interface 3300 or data processed by the central processing unit 3100 may be stored in the memory system 2000.

The memory device 2100 may be coupled to the system bus 3500 through the controller 2200, or directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 described with reference to FIG. 9 or the memory system 1000 described with reference to FIG. 8. In addition, the computing system 3000 may include both of the memory systems 1000 and 2000 described with reference to FIGS. 8 and 9.

According to embodiments, a semiconductor device having improved operational characteristics and reliability and an operating method of the semiconductor device may be provided.

Examples of embodiments have been disclosed herein, and although specific terms are employed, various changes in forms and details may be made to the above-described examples of embodiments without departing from the spirit and scope of the present disclosure. Accordingly, it will be understood by those skilled in the art that the scope of the present disclosure should not be limited to the above-described examples of embodiments, and may cover the scope of the following claims and their equivalents.

What is claimed is:

1. A method of operating a semiconductor device comprising memory strings that are coupled between a common source line and a bit line, wherein each of the memory strings comprises memory cells, select transistors, and a dummy memory cell that is coupled between the memory cells and the select transistors, the method comprising:
    applying a first pass voltage to unselected word lines among word lines coupled to the memory cells, respectively;
    applying an initial voltage lower than the first pass voltage to a dummy word line coupled to the dummy memory cell when the first pass voltage is applied;
    increasing the first pass voltage and the initial voltage to a second pass voltage; and
    sensing data from a selected memory cell of a selected memory string among the memory strings.

2. The method of claim 1, wherein the first pass voltage is applied to the unselected word lines after applying the initial voltage to the dummy word line.

3. The method of claim 1, wherein the initial voltage is a ground voltage.

4. The method of claim 1, wherein select lines are coupled to the select transistors, respectively, a turn-on voltage is applied to a drain select line among the select lines and a turn-off voltage is applied to a source select line among the select lines, when the first pass voltage is applied.

5. The method of claim 1, wherein select lines are coupled to the select transistors, respectively, a turn-on voltage is applied to a selected drain select line among the select lines and a turn-off voltage is applied to an unselected drain select line among the select lines, when the second pass voltage is applied.

6. The method of claim 1, wherein the first pass voltage is applied to a selected word line among the word lines when the first pass voltage is applied to the unselected word lines, and
    wherein a read voltage is applied to the selected word line after applying the second pass voltage to the selected word line when the second pass voltage is applied to the unselected word lines and the dummy word line.

7. The method of claim 6, wherein a voltage of the selected word line is increased to the read voltage after the voltage of the selected word line is decreased from the second pass voltage to a ground voltage.

8. The method of claim 1, wherein introduction of a carrier from the common source line or the bit line into channel regions of the memory strings is mitigated when the first pass voltage is applied.

9. The method of claim 1, further comprising applying a read voltage to a selected word line among the word lines coupled to the memory cells.

10. A semiconductor device, comprising:
    memory strings coupled between a common source line and a bit line; and
    a peripheral circuit coupled to the memory strings through a plurality of word lines and a dummy word line, and configured to set biases to the word lines and the dummy word line before performing a sensing operation,
    wherein the peripheral circuit applies a first pass voltage to the word lines concurrently with applying an initial voltage lower than the first pass voltage to the dummy word line, and increases the first pass voltage and the initial voltage to a second pass voltage to set the biases of the word lines and the dummy word line.

* * * * *